United States Patent

McConnell et al.

Patent Number: 5,986,952
Date of Patent: Nov. 16, 1999

[54] REDUNDANCY CONCEPT FOR MEMORY CIRCUITS HAVING ROM MEMORY CELLS

[75] Inventors: Roderick McConnell, München, Germany; Klaus Bernauer, Salzburg, Austria; Jochen Breilmann, San Jose, Calif.; Manfred Bromba; Eckehard Plättner, both of München, Germany; Konrad Schönemann, Unterschleissheim, Germany

[73] Assignee: Siemens Aktiengesellschaft, Munich, Germany

[21] Appl. No.: 09/204,927

[22] Filed: Dec. 3, 1998

Related U.S. Application Data

[63] Continuation of application No. PCT/DE97/01016, May 21, 1997.

[30] Foreign Application Priority Data

Jun. 3, 1996 [DE] Germany .......................... 196 22 275

[51] Int. Cl.⁶ ...................................................... G11C 7/00
[52] U.S. Cl. .......................................... 365/200; 371/10.1
[58] Field of Search .............................. 365/200, 230.03; 371/10.1, 10.2, 10.3, 21

[56] References Cited

U.S. PATENT DOCUMENTS

| | | | |
|---|---|---|---|
| 4,601,031 | 7/1986 | Walker et al. | 371/10 |
| 4,782,466 | 11/1988 | Yamaguchi et al. | 365/200 |
| 5,500,821 | 3/1996 | Tanaka | 365/200 |
| 5,535,162 | 7/1996 | Uenoyama | 365/200 |
| 5,644,541 | 7/1997 | Siu et al. | 365/200 |
| 5,657,280 | 8/1997 | Shin et al. | 365/200 |

FOREIGN PATENT DOCUMENTS

4433504A1  3/1995  Germany .

*Primary Examiner*—Son T. Dinh
*Attorney, Agent, or Firm*—Herbert L. Lerner; Laurence A. Greenberg

[57] ABSTRACT

Addressable first units having ROM memory cells, for example word or bit lines, can be replaced by redundant second units having RAM memory cells. This has the advantage that the RAM memory cells can be realized with a smaller area than alternative PROM memory cells. The invention can be applied particularly advantageously to DROM memories.

5 Claims, 4 Drawing Sheets

REDUNDANCY CONCEPT FOR MEMORY CIRCUITS HAVING ROM MEMORY CELLS

CROSS-REFERENCE TO RELATED APPLICATION

This is a continuation of copending International Application PCT/DE97/01016, filed May 21, 1997, which designated the United States.

BACKGROUND OF THE INVENTION

Field of the Invention

The invention relates to a redundancy concept for integrated memory circuits having ROM memory cells.

Hardware redundancy in integrated memories is generally understood to be address replacement of addressable units of memory cells within the memory by redundant units of memory cells. In this case, the addressable units may be word or bit lines, for example. The so-called situation of redundancy occurs when it is established during a memory test that one of the replaceable addressable units has defects. The memory is then manipulated such that upon application of the address of the unit to be replaced, the redundant unit rather than the latter is addressed. In general, a corresponding memory test is carried out following fabrication of the memory, with the result that the redundancy repair can be performed immediately afterward.

In the case of RAM memories (Random Access Memory, read and write memory), it is customary to provide redundant word or bit lines which likewise have RAM memory cells, like the "normal" word and bit lines.

One possible way of providing redundancy in a ROM memory (Read Only Memory) is described in U.S. Pat. No. 5,388,075, which shows that defective ROM memory cells are replaced by redundant programmable ROM memory cells (PROM memory cells). The ROMs which, in the event of redundancy, are programmed by fuses in such a way that they subsequently contain the data to be stored in the memory cells to be replaced. The solution has the disadvantage that the redundant memory cells, in the form of PROM memory cells, are relatively large.

U.S. Pat. No. 4,601,031 describes a repairable ROM memory in which a defective row of ROM memory cells is replaced by a redundant row having RAM memory cells. Each column of the ROM memory cell array contains a check bit, and the data to be stored in the redundant row are reconstructed with the aid of the check bit. Reconstructed data are written to the redundant row in the course of initialization of the memory.

SUMMARY OF THE INVENTION

It is accordingly an object of the invention to provide a redundancy concept for memory circuits having ROM memory cells which overcomes the above-mentioned disadvantages of the prior art devices of this general type, in which the redundant memory cells have a small area requirement.

With the foregoing and other objects in view there is provided, in accordance with the invention, a memory circuit, including: individually addressable first units having ROM memory cells; at least one redundant second unit having RAM memory cells for address replacing one of the first units in an event of redundancy; a redundancy detector for determining an address of the first units replaced by the at least one redundant second unit in the event of redundancy; a repair means for subsequently determining data to be stored originally in the ROM memory cells of the first units replaced by the at least one redundant second unit and for storing the data in the RAM memory cells of the at least one redundant second unit replacing the first units; the RAM memory cells each having a selection transistor and a storage capacitor electrically connected to the selection transistor; the ROM memory cells storing data of a first logic state and each have a selection transistor and a storage capacitor electrically connected to the selection transistor identical to the RAM memory cells; and the ROM memory cells storing data of a second logic state each having a selection transistor and a storage capacitor electrically disconnected from the selection transistor resulting in modified memory cells differing from the RAM memory cells.

The invention provides for "normal" addressable first units having ROM memory cells to be replaced by redundant addressable second units having RAM memory cells. In this case, the first and second units may be, for example, word or bit lines or, under certain circumstances, even entire memory blocks.

A memory test is preferably effected directly following the fabrication process of the memory. The inventive replacement of defective units of the first units can subsequently be performed. In order to re-establish the memory cell content of the replaced ROM memory cells in the volatile redundant RAM memory cells, a development of the invention provides for initialization to be carried out each time the memory is started up (that is to say when the supply voltage is applied), in the course of which initialization the memory cell contents are reconstructed and stored in the RAM memory cells. This initialization of the memory can be carried out by a processor.

The use of redundant RAM memory cells has the advantage that the latter can be realized with a smaller area than PROM memory cells which are provided as redundant memory cells in the case of U.S. Pat. No. 5,388,076 mentioned above. This is true above all when redundant DRAM memory cells (Dynamic RAM) are involved.

The invention is particularly advantageous in so-called DROM memories (Dynamic ROM) (U.S. Pat. No. 5,388,076 also describes a DROM), although it is not restricted to memories of this type. DROMs are a variant of a ROM and have ROM memory cells that have the same construction and the same cell structure as DRAM memory cells. The ROM memory cells have the same electrical components and the same dimensions as RAM memory cells. A DROM can be fabricated in a simple manner by slightly altering the fabrication process of a DRAM, and a ROM having memory cells which are just as small as DRAM memory cells is obtained in this way.

In this case, at least some of the ROM memory cells of a DROM are modified in terms of its construction in comparison with normal DRAM memory cells. Thus, in a first realization embodiment, for example, the electrical connection between a selection transistor and a memory cell capacitor of the DRAM memory cell can be present in a ROM memory cell provided that a datum of a first logic state is stored in the ROM memory cell. In order to store a datum of a second logic state, on the other hand, there is no electrical connection between selection transistor and memory cell capacitor of the corresponding ROM memory cell. No charge can then be stored in the memory cell capacitor of the last-mentioned, modified memory cells, so that when the memory cell is read out via the selection transistor, the potential of a bit line connected to the selection transistor remains virtually uninfluenced.

A second realization embodiment for the ROM memory cells of a DROM provides for that terminal of the selection transistor which is normally connected to the memory cell capacitor to be connected to different fixed potentials, depending on the logic state of the datum to be stored (this is shown in the above-mentioned U.S. Pat. No. 5,388,076).

In accordance with an added feature of the invention, there is an addressable third unit having read-only memory cells for storing parity bits, the repair means determining the data to be stored originally in the ROM memory cells of the first units replaced by the at least one redundant second unit is accomplished by error correction codes using the parity bits.

In accordance with an additional feature of the invention, to determine if one of the first units having the modified memory cells has been replaced by the at least one redundant second unit in the event of redundancy, data of the first logic state are written to and read out again from all of the ROM memory cells and the RAM memory cells wherein the ROM memory cells and the RAM memory cells are addressed by application of an address of the first units having the modified memory cells, the data written in is subsequently compared to the data read out, a determination of the data to be stored originally and the storage of the data in the ROM memory cells and the RAM memory cells corresponding to a respective address only being effected in an event of a correspondence between the data written in and the data read out.

In accordance with another feature of the invention, the redundancy detector has a read-only memory for storing information regarding which of the first units contain the modified memory cells in an event of no errors.

In accordance with a concomitant feature of the invention, there is a redundancy decoder outputting a redundancy activation signal received by the at least one redundant second unit and the redundancy detector for determining addresses of the first units replaced by the at least one redundant second unit and for activating the at least one redundant second unit.

Other features which are considered as characteristic for the invention are set forth in the appended claims.

Although the invention is illustrated and described herein as embodied in a redundancy concept for memory circuits having ROM memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
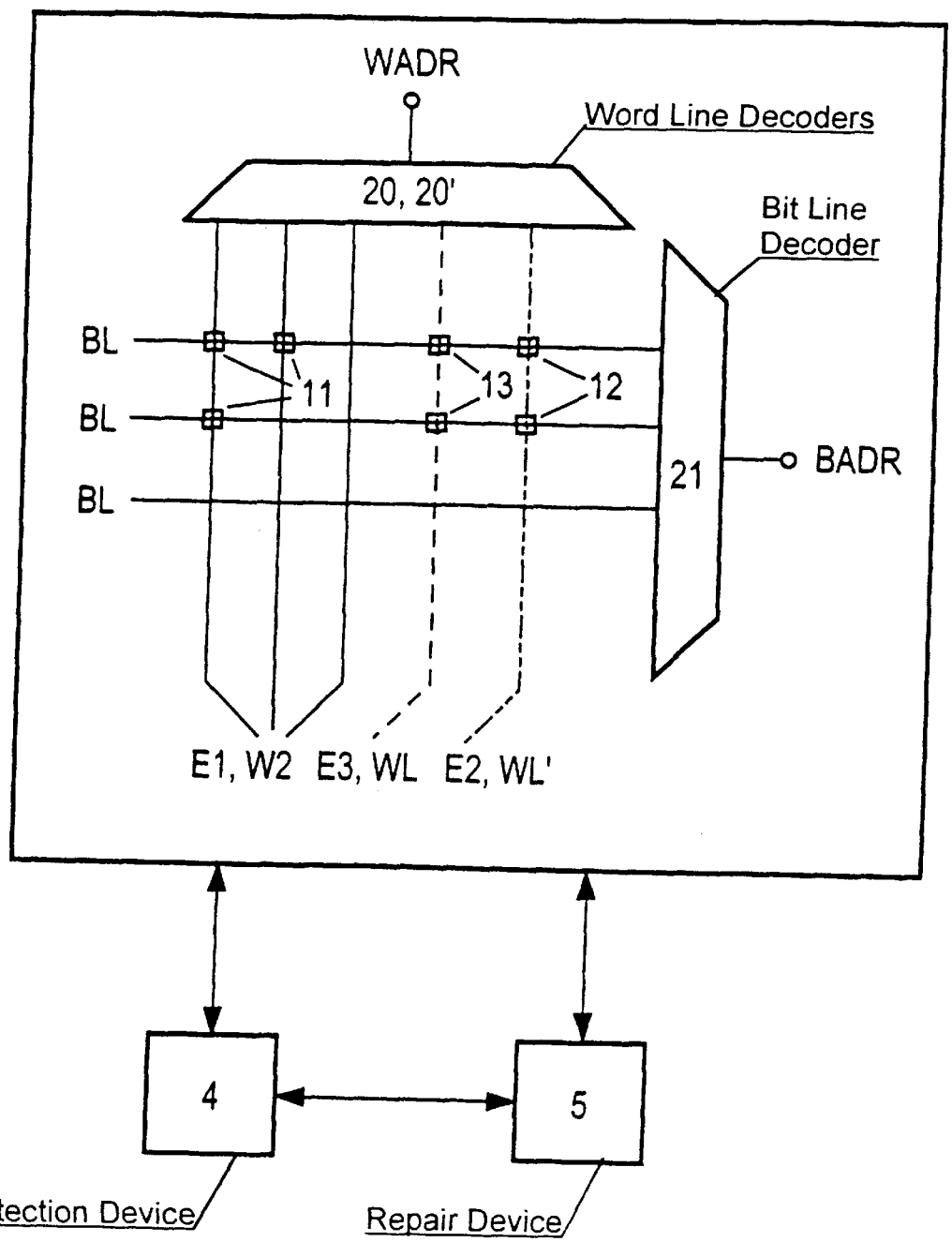
FIG. 1 is a diagrammatic block diagram of an exemplary embodiment according to the invention.

In all the figures of the drawing, sub-features and integral parts that correspond to one another bear the same reference symbol in each case. Referring now to the figures of the drawing in detail and first, particularly, to FIG. 1 thereof, there is shown an integrated memory according to the invention. The memory has bit lines BL, "normal" word lines WL and redundant word lines WL', at whose crossover points memory cells 11, 12, 13 are disposed. The word lines WL can be addressed via a word line decoder 20 and the redundant word lines WL' can be addressed via a redundant word line decoder 20' (both are illustrated as one unit in FIG. 1), while the bit lines BL are addressed via a bit line decoder 21. For this purpose, word addresses WADR and bit addresses BADR can be applied to the corresponding decoders 20, 20', 21.

Three of the normal word lines WL illustrated are in each case individually addressable "normal" first units E1 having ROM memory cells 11. The first units E1 serve as memories, provided that no redundancy occurs. The redundant word lines WL' are redundant second units E2 having RAM memory cells 12 and serve for address replacement of in each case one of the first units E1 in the event of redundancy. In addition, one of the normal word lines WL is a third addressable unit E3 having read-only memory cells 13.

A redundancy repair is preferably performed directly after the fabrication of the integrated memory and after a memory test has been carried out. A defective unit of the first units E1 can then be replaced in terms of addresses by the second unit E2. The redundant word line decoder 20' must be correspondingly programmed for this purpose, which corresponds to a conventional hardware redundancy repair and is therefore known to a person skilled in the art.

In the read-only memory cells 13 of the third unit E3 it is possible to store parity bits, which serve for the reconstruction of the data content of defective cells of the ROM memory cells 11 by error correction codes in an extended initialization phase of the memory during its start-up, as will be explained further below. The initialization according to the invention is to be performed each time the memory is started up, since, as is known, RAM memory cells are volatile memories.

The memory according to the invention in FIG. 1 additionally has a redundancy detection device 4 and a repair device 5. The addresses of replaced units of the first units E1 can be determined by the redundancy detection device 4 in the event of redundancy. Reconstruction or repair of the data to be stored originally in the replaced cells of the ROM memory cells 11 can thereupon be carried out by the repair device 5 in such a way that these data are subsequently stored in the RAM memory cells 12 that replace them. After the replacement of one of the first units E1 in the event of redundancy by the second unit E2, an initialization can be carried out each time the memory is started up, in the course of which initialization the content of the volatile, redundant RAM memory cells 12 is re-established.

The redundancy detection device 4 and the repair device 5 can be realized by a microprocessor, for example, which performs the address identification of defective first units and the reconstruction of the erroneous data in the redundant RAM memory cells 12. The processor 4 may be disposed on the same integrated circuit as the integrated memory or on a separate integrated circuit.

The error correction by the repair device 5 can be carried out for example by error correction codes with the assistance of the parity bits stored in the third units E3. The parity bits permit the reconstruction of individual memory errors within one of the word lines WL with the assistance of the other data stored in the memory cells of the word line WL.

It is advantageous to dispose the third units E3 having the read-only memory cells 13 in the same memory cell array as the first units E1. The read-only memory cells 13 are then of the same type of memory cells as the ROM memory cells 11 (for example DROM memory cells). However, it is also alternatively possible for the third units E3 to be disposed in a memory separate from the first units E1.

Instead of individual parity bits (a third unit E3), it is also possible to provide parity symbols having a plurality of parity bits, for example parity bytes. A plurality of third units E3 are then present.

Error correction codes for the reconstruction of erroneously stored data are known to a person skilled in the art and are not explained further here. By way of example, only the Reed-Solomon code and the Hamming code are mentioned.

After the implementation of the repair in the event of redundancy, therefore, the data to be stored originally in the ROM memory cells 11 to be replaced are stored in the RAM memory cells 12 that replace them.

FIG. 1 shows, by way of example, only a few normal word lines WL and a redundant word line WL' and a few bit lines BL. Naturally, a real memory has a great deal more lines of this type. In addition, a plurality of third units E3 having parity bits may be provided. The invention, instead of being applied to word line redundancy, can, of course, be alternatively or additionally applied to bit line redundancy as well.

Figure 2:
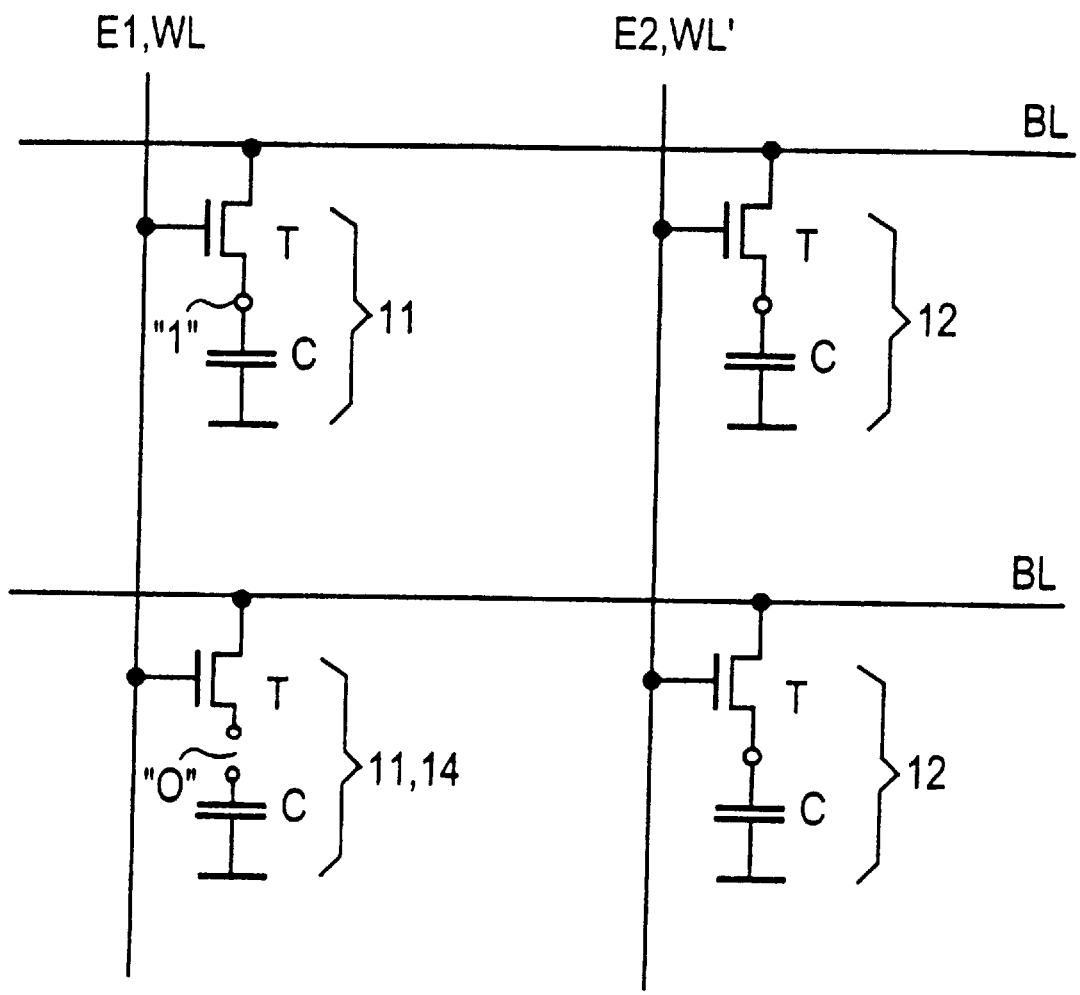
FIG. 2 is a schematic of a detail from FIG. 1.

FIG. 2 shows, as a detail view, a possible embodiment of some of the ROM memory cells 11 and of the RAM memory cells 12 in FIG. 1. In order to improve clarity, only two of the bit lines BL and one of the word lines WL (first unit E1) and also only one of the redundant word lines WL' (second unit E2) are illustrated. It is assumed for the exemplary embodiment illustrated that the integrated memory is a DROM memory.

The illustrated detail of the integrated memory includes two "normal" or "regular" ROM memory cells 11 and two redundant RAM memory cells 12, which are single-transistor DRAM memory cells. As already explained, DROMs have ROM memory cells having the same cell structure as DRAM memory cells. Therefore, each of the ROM memory cells 11 and of the RAM memory cells 12 has a selection transistor T and a memory cell capacitor C. The selection transistors T are opened via the word lines WL, WL' given corresponding addressing and the content of the memory cell capacitor C can then be read out via the bit lines BL.

The ROM memory cell 11 at the top left in FIG. 2 has an electrical connection between the selection transistor T and the memory cell capacitor C, as is also the case with the RAM memory cells 12. In contrast, this connection is not present in the ROM memory cell 11 at the bottom left, it is a modified memory cell 14. The presence or absence of the electrical connection is defined during the fabrication of the integrated memory, while the ROM memory cells 11 are programmed, that is to say have data written to them, for example by mask programming. It is assumed that a datum of a first logic state 1 has been stored in the ROM memory cell 11 at the top left, while a datum of a second logic state 0 has been stored in the ROM memory cell 11 at the bottom left (the modified memory cell 14). In this case, the first logic state is intended to be defined by a high potential and the second logic state by a low potential.

The initialization of the memory is described below, in the course of which initialization not only (as already known in the case of DROMs) are the contents of the intact ROM memory cells 11 loaded into the latter but also (according to the invention) reconstruction of the contents of the volatile redundant RAM memory cells 12 is effected.

During the start-up of a DROM in which the memory cells are configured like the ROM memory cells in FIG. 2, a so-called "initialization" can be carried out, as already mentioned, during each start-up. In this case, data of the first logic state can be written to all of the ROM memory cells 11 by a processor. The write-in operation succeeds, however, only in the case of those ROM memory cells 11 in which the connection between the selection transistor T and the memory cell capacitor C is present. If the ROM memory cells 11 are subsequently read out, a datum of the first logic state 1 is obtained as a result only in the case of the last-mentioned, non-modified cells of the ROM memory cells 11. In contrast, the floating (not connected to any fixed potential) terminal of the selection transistor T in the case of the modified memory cells 14 scarcely influences the potential of the corresponding bit line BL during the read-out operation, from which a datum of the second logic state 0 can be identified.

If the "normal" word line WL, which forms the first unit E1, is now defective altogether or if it has individual defective ROM memory cells 11 (which can be ascertained by a test which, for example, can be carried out at the end of the fabrication process of the integrated circuit, but possibly later as well), then it can be replaced in terms of addresses by the redundant word line WL' (second unit E2) in the event of redundancy. The second unit E2 has only RAM memory cells 12. In the case of the exemplary embodiment illustrated, 1-he RAM memory cells 12 are DRAM memory cells.

The ROM memory cells 11 for storage of data of the first logic state 1 are thus constructed in exactly the same way as the RAM memory cells 12. On the other hand, the ROM memory cells 11 as modified memory cells 14 for storage of data of the second logic state 0 differ from the RAM memory cells 12 insofar as the electrical connection between the selection transistor T and the memory cell capacitor C is not present.

The redundancy detection device 4 and the repair device 5 are advantageously used in the course of the initialization according to the invention. Each time the memory according to the invention is started up, the redundancy detection device 4 can determine whether a first unit E1, and if appropriate which, has been replaced by one of the redundant second units E2. Data of the correct logic state, as should actually be stored in the ROM memory cells 11 of the respectively replaced first unit E1, can subsequently be stored by the repair device 5 in the second units E2. After the conclusion of the initialization phase, which is lengthened by comparison with the DROM initialization practiced to date, the integrated memory is ready for operation.

By virtue of the fact that both the "normal" ROM memory cells 11 and the redundant RAM memory cells 12 have the same cell structure, the resulting fabrication process for the integrated memory is very simple. The area for realizing the redundant second units E2 is very small since, in particular, the transistor DRAM memory cells shown in this exemplary embodiment have a very small space requirement. Therefore, the invention is very well suited to use in DROMs, which, as is known, are fabricated by modifying a DRAM fabrication process. However, the invention is not limited to DROMs. Moreover, the redundant RAM memory cells 12 do not necessarily have to be transistor DRAM memory cells. Other RAM memory cells are also suitable.

The read-only memory cells 13 of the third units E3 (not illustrated in FIG. 2) may advantageously likewise be DROM memory cells like the ROM memory cells 11 in FIG. 2. In particular, they may be part of the same memory cell array as the latter cells.

Figure 3:
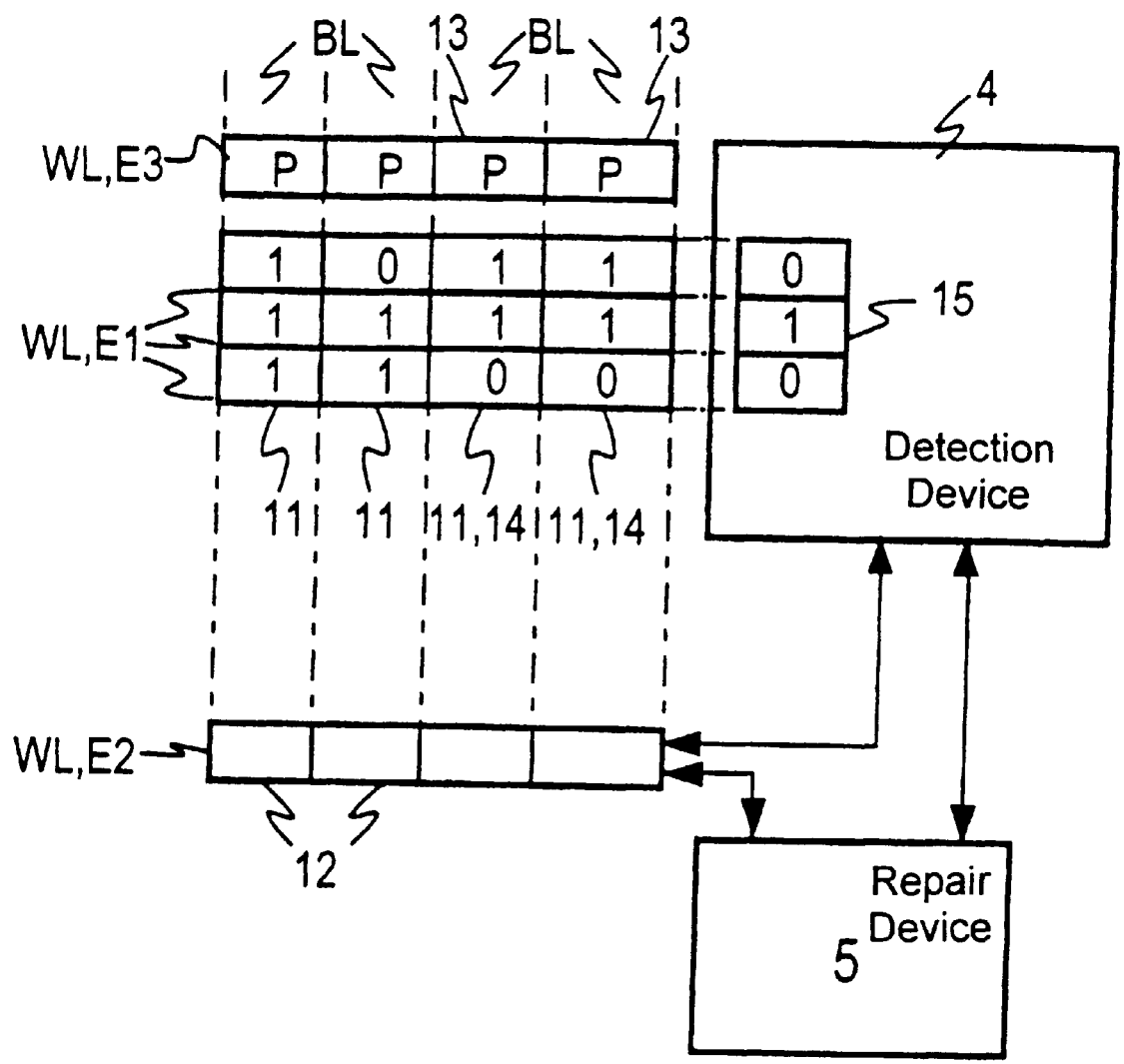
FIGS. 3 and 4 are block diagrams of other exemplary embodiments of the invention.

In a simplifying form of illustration, FIG. 3 shows other details from the memory of FIG. 1. Three first units E1, which are word lines WL, are illustrated. They have ROM memory cells 11, some of which are modified memory cells 14 in the sense described above. In the case of the mode of illustration chosen, the logic states 0, 1 that have been entered are intended to represent not the actual memory cell content but the desired memory cell content in the event of freedom from errors of the corresponding first unit E1. The desired memory cell content may differ from the actual memory cell content on account of errors during the fabrication of the integrated circuit and/or during the programming of the ROM.

FIG. 3 also shows the second unit E2 having redundant RAM memory cells 12, which serves for replacement of one of the first units E1 in the event of redundancy. The third unit E3 has the read-only memory cells 13 for storage of the parity bits P. The first E1, second E2 and third E3 units are in each case word lines WL, WL'.

The functioning of an exemplary embodiment of the redundancy detection device 4 and of the repair device 5 will now be explained below.

The redundancy detection device 4 in FIG. 3 contains a read-only memory 15, which has just as many memory locations as there are first units E1. The broken connecting lines indicate that each memory location of the read-only memory 15 can advantageously be part of one of the first units E1. Information items which specify whether or not the associated first unit E1 has modified memory cells 14 in the event of data stored without any errors are stored in the read-only memory 15. As already mentioned above, fabrication defects can result in a non-modified memory cell 11 being produced instead of a modified memory cell 14 that is actually intended to be fabricated. The information items in the read-only memory 15 can be stored there at the same time as the programming of the memory, that is to say, as a rule, during fabrication of the memory.

In the case of the exemplary embodiment illustrated, a 0 is entered in the read-only memory 15, provided that the associated first unit E1 has a modified memory cell 14 in the error-free case. A 1 is stored in the read-only memory 15 when the associated first unit E1 has no modified memory cells 14 in the event of the error-free case.

Since it is now the task of the redundancy detection device 4 to determine the address of a replaced unit of the first units E1, in order subsequently to apply error correction measures thereto using the repair device 5, the procedure is as shown below.

Data of the first logic state 1 are written to each of the memory cells 11, 12 by the respective first unit E1 ((Dr, in the event of redundancy, the second unit E2 instead of the respective first unit E1 to be replaced) being addressed. If the first unit E1 is one that has exclusively non-modified memory cells 11, t his can be identified by the redundancy detection device 4 from the corresponding entry in the associated read-only memory 15. For such a first unit E1 having non-modified ROM memory cells 11 which, according to FIG. 2, are no different from a DRAM memory cell 12, replacement by the second unit E2 having RAM memory cells 12 in the event of redundancy is completely unproblematic. After the initialization which is carried out during the starting-up of the memory, the second unit E2 then has the data of the first logic state 1 which are written in the process. The reconstruction of the data stored in the redundant RAM memory cells 12 is thus already concluded.

If, however, the redundancy detection device 4 ascertains on the basis of the corresponding entries in the read-only memory 15 that the respectively addressed first unit E1 is one which should actually include modified memory cells 14 as well, the invention provides for the initialization of the entire memory with data of the first logic state 1 to be followed by the reading-out again of at least all the memory cells of the first units 1 having modified memory cells 14. If the result in this case is that one of the first units E1, on the basis of the entry in the read-only memory 15, should actually have modified memory cells 14, but during the read-out of the memory cells addressed with the corresponding address only data of the first logic state 1 are read out, then it is established that in this case, under the corresponding address, a first unit E1 having modified memory cells 14 has been replaced by the second unit E2 having RAM memory cells 12 (redundancy situation). This is due to the fact that data of the first logic state 1 cannot be written to the modified memory cells 14 since the memory cell capacitor C thereof is not connected to the selection transistor T (see FIG. 2). For this reason, as stated, data of the first logic state 1 cannot be written to modified memory cells 14.

What has just been described will now be explained once again with reference to FIG. 3:

If, in the event of redundancy, the middle unit of the first units E1 in FIG. 3, which has only non-modified ROM memory cells 11, has been replaced by the second unit E2, then on account of the first part of the initialization (writing the first logic state 1 to all of the memory cells 11, 12), it is not necessary for any further measures for repair of the data content of the replaced ROM memory cells 11 to be carried out by the repair device 5, since the correct data are already stored in that case in the redundant RAM memory cells 12.

If, on the other hand, in the event of redundancy, in FIG. 3 the upper or lower unit of the first units E1 having modified memory cells 14 has been replaced by the second unit E2, then it is necessary for the repair device 5, with the assistance of error correction codes, to perform a reconstruction of the data content of the individual replaced ROM memory cells 11 and to store the reconstructed data in the RAM memory cells 12. In this case, it is possible to make use for example of the parity bits P in the read-only memory cells 13, as explained with regard to FIG. 1.

Figure 4:
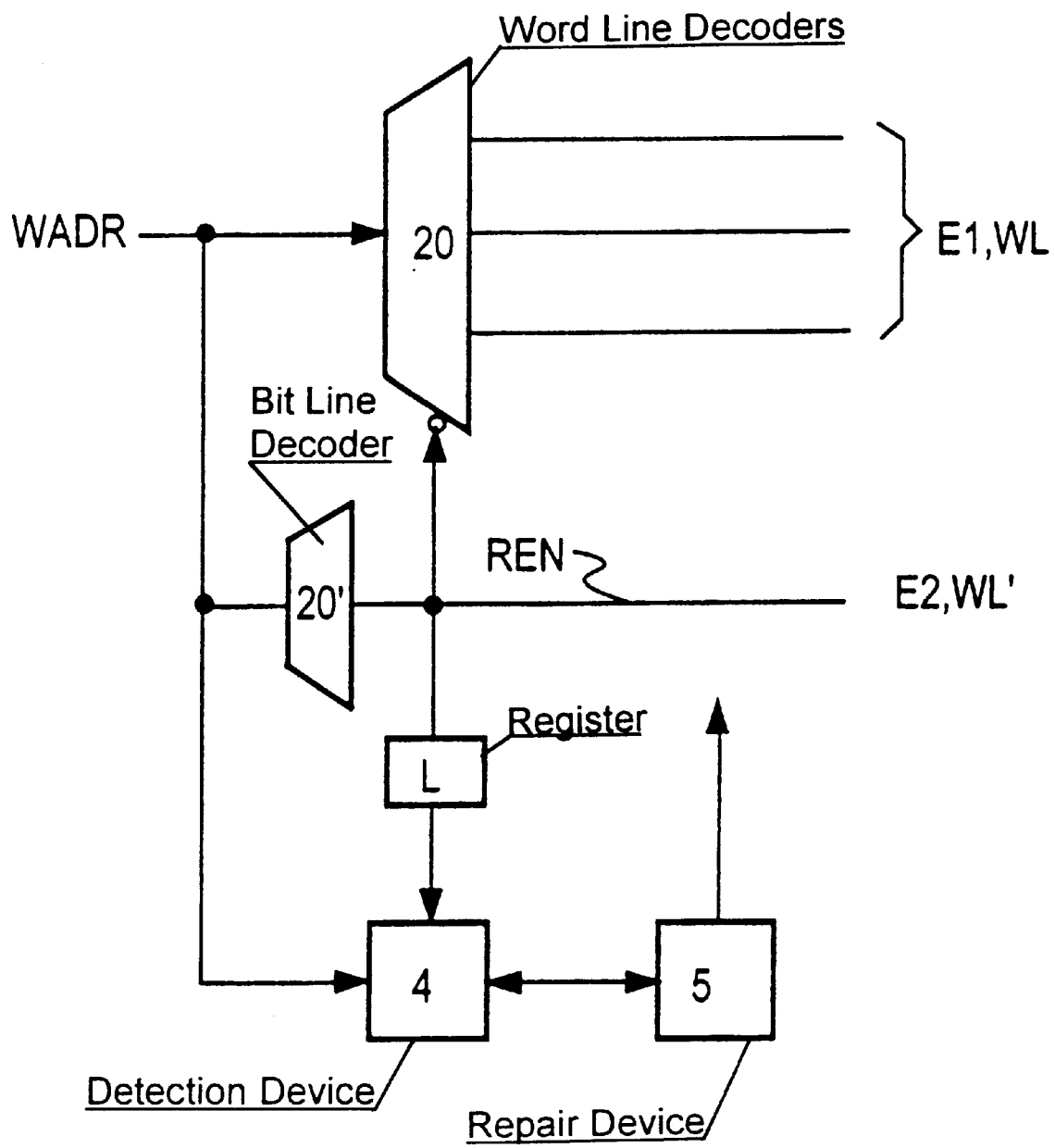

FIG. 4 shows a different exemplary embodiment of details of the memory in FIG. 1. The first units E1 and the second units E2 are, as in FIG. 1, "normal" word lines WL and redundant word lines WL', respectively. Word addresses WADR for the addressing of the normal word lines WL can be decoded by the normal word line decoder 20 and the corresponding word line WL can be selected in this way. At the same time, the word address WADR can be decoded by a redundancy word line decoder 20' (which is illustrated as one unit together with the word line decoder 20 in FIG. 1). If, in the event of redundancy, one of the first units E1 has been replaced by the second unit E2, the corresponding word address WADR is programmed in the redundancy word line decoder 20'. This is customarily done by fuses following the fabrication and testing of the memory. If the redundancy word line decoder 20' then responds to an applied word address WADR, it generates a redundancy activation signal REN, which leads, on the one hand, to deactivation of the normal word line decoder 20 and, on the other hand, to selection of the corresponding redundant word line WL'.

The invention now provides for the redundancy activation signal REN to be used in order to determine the addresses of replaced first units E1 by the redundancy detection device 4. For this purpose, the redundancy detection device 4 can record the applied word addresses WADR for which the redundancy activation signal REN for selection of the second unit E2 is generated by the redundancy word line decoder 20'. In this way, the addresses sought can be determined in a particularly simple manner, whereupon the repair device 5 can then carry out the reconstruction of the data stored in the memory cells to be replaced and the storage of said data in the memory cells of the second unit E2.

FIG. 4 shows a register L, in which the redundancy activation signal REN can be stored, as required. This may be necessary if the processor which performs the functions of the redundancy detection device 4 and of the repair device 5 does not have multitasking capability, with the result that buffer storage in the register L is effected prior to evaluation of the redundancy activation signal REN by the redundancy detection device 4.

It is particularly advantageous, in other exemplary embodiments of the invention, to combine the first units E1 into groups, each of these groups being assigned a third unit E3 having read-only memory cells 13. Very good error correction can be achieved by such partitioning, even with only one parity bit per group and per word and/or bit line, without necessitating the use of a relatively complex error correction code.

The invention is not restricted only to the replacement of ROM memory cells of a DROM by DRAM memory cells. In general, the invention enables redundancy of any desired ROM memory cells by any desired RAM memory cells.

According to the invention, it is not only possible, in the case of a DROM having two types of ROM memory cells (namely modified and non-modified memory cells), to provide RAM memory cells as redundancy for both types of memory cells. Furthermore, the invention can also be applied to memories having both DROM and DRAM areas.

We claim:

1. A memory circuit, comprising:
   individually addressable first units having ROM memory cells;
   at least one redundant second unit having RAM memory cells for address replacing one of said first units in an event of redundancy;
   a redundancy detector for determining an address of said one of said first units replaced by said at least one redundant second unit in the event of redundancy;
   a repair means for subsequently determining data to be stored originally in said ROM memory cells of said one of said first units replaced by said at least one redundant second unit and for storing said data in said RAM memory cells of said at least one redundant second unit replacing said one of said first units;
   said RAM memory cells each having a selection transistor and a storage capacitor electrically connected to said selection transistor;
   said ROM memory cells storing data of a first logic state and each having a selection transistor and a storage capacitor electrically connected to said selection transistor identical to said RAM memory cells; and
   said ROM memory cells storing data of a second logic state and each having a selection transistor and a storage capacitor electrically disconnected from said selection transistor resulting in modified memory cells differing from said RAM memory cells.

2. The memory circuit according to claim 1, including an addressable third unit having read-only memory cells for storing parity bits, said repair means determining said data to be stored originally in said ROM memory cells of said first units replaced by said at least one redundant second unit is accomplished by error correction codes using said parity bits.

3. The memory circuit according to claim 1, wherein to determine if one of said first units having said modified memory cells has been replaced by said at least one redundant second unit in the event of redundancy data of the first logic state are written to and read out again from all of said ROM memory cells and said RAM memory cells wherein said ROM memory cells and said RAM memory cells are addressed by application of an address of said first units having said modified memory cells, the data written in is subsequently compared to the data read out, and a determination of said data to be stored originally and the storage of said data in said ROM memory cells and said RAM memory cells corresponding to a respective address only being effected in an event of a correspondence between the data written in and the data read out.

4. The memory circuit according to claim 3, wherein said redundancy detector has a read-only memory for storing information regarding which of said first units contain said modified memory cells in an event of no errors.

5. The memory circuit according to claim 1, including a redundancy decoder outputting a redundancy activation signal received by said at least one redundant second unit and said redundancy detector for determining addresses of said first units replaced by said at least one redundant second unit and for activating said at least one redundant second unit.

* * * * *